United States Patent [19]

Ernst et al.

[11] 4,322,835
[45] Mar. 30, 1982

[54] HOUSING ASSEMBLY FOR INSTRUMENTS

[75] Inventors: Heinz Ernst, Frankfurt am Main; Gerhard Wesner, Steinbach, both of Fed. Rep. of Germany

[73] Assignee: VDO Adolf Schindling AG, Fed. Rep. of Germany

[21] Appl. No.: 188,743

[22] Filed: Sep. 15, 1980

[30] Foreign Application Priority Data

Sep. 14, 1979 [DE] Fed. Rep. of Germany ....... 2937206

[51] Int. Cl.³ .............................................. G04B 37/00
[52] U.S. Cl. .................................... 368/317; 368/316; 368/276; 248/114; 248/116; 206/301; 206/305; 73/431
[58] Field of Search ................ 73/431; D10/1, 18, 19, D10/26; 368/309, 316, 317, 276; 200/303; 248/114, 115, 116; 174/52 R; 206/301, 305, 18, 467; 361/423, 394, 386

[56] References Cited

U.S. PATENT DOCUMENTS

| | | | |
|---|---|---|---|
| D. 249,873 | 10/1978 | Zabransky | D10/26 |
| 2,144,523 | 1/1939 | Brown | 73/431 |
| 2,558,518 | 6/1951 | Heymann | 368/309 |
| 2,559,480 | 7/1951 | Taegtstroem | 368/316 |
| 3,461,663 | 8/1969 | Albinger, Jr. et al. | 368/309 X |
| 3,765,249 | 10/1973 | Bissell | 73/431 |
| 3,905,189 | 9/1975 | Siefert et al. | 368/316 |
| 4,090,632 | 5/1978 | Katzmann et al. | 174/52 R X |

*Primary Examiner*—Roy N. Envall, Jr.
*Assistant Examiner*—Bernard Roskoski
*Attorney, Agent, or Firm*—Eric P. Schellin

[57] ABSTRACT

Housing for measuring instruments comprising at least two interconnectable housing elements, at least one of which includes the viewing window, and a resilient stirrup clamp including shanks engaging two opposite wall surfaces of the housing, having recesses and/or projections provided on two opposite wall surfaces, which are formed by at least two housing elements, on each side of a separating line, which recesses or projections correspond with projections and/or recesses of intermediate elements on the wall surfaces, being engaged by the stirrup clamp under elastic pressure directed toward the two wall surfaces.

14 Claims, 4 Drawing Figures

HOUSING ASSEMBLY FOR INSTRUMENTS

FIELD OF THE INVENTION

The invention relates to a housing for measuring instruments comprising at least two connectable housing elements at least one of which includes the viewing window, and a stirrup clamp, simultaneously serving as a mount or stand, the shanks of which engage two opposite wall surfaces of the housing elements.

DESCRIPTION OF THE PRIOR ART

Measuring instrument housings are known in which the housing is formed in a single piece and is closed on its front side by a viewing window. The attachment of the viewing window to the housing is accomplished by means of a flanged front ring. A bracket which serves as a mount or stand is rotatably attached to the housing with two rivets. These housings have the disadvantage that they have a construction which makes mounting and repair of the measuring instrument without special tools to open and close the housing, difficult.

Other measuring instrument housings are known such as that described in (German DE-OS No. 27 19 389), which consist of two clamp-together housing half shells, which are both formed with grooves to receive the face plate and the viewing window. These housings can be opened and closed without special tools, so that a repair of the measuring instrument or a replacement of the face plate can be performed without difficulty. The clamp connection for the two housing half shells is visible and has a negative effect on the overall aesthetic impression and therefore these housings are not suitable as an add-on or mounting units but only as inserts to be built into control panels and dashboards. A further disadvantage of these housings is that relatively complicated mold tools are needed in their manufacture.

SUMMARY

The primary object of the invention is to provide a measuring instrument housing of the above-described type, which can be simply manufactured, and mounted and can easily be opened and closed without tools, for example for purposes of repair and with a minimum of effort and expense. Other objects and advantages of the invention will become apparent to those skilled in the art from the following specification, claims and drawings.

DESCRIPTION OF THE PREFERRED EMBODIMENTS

Figure 1:
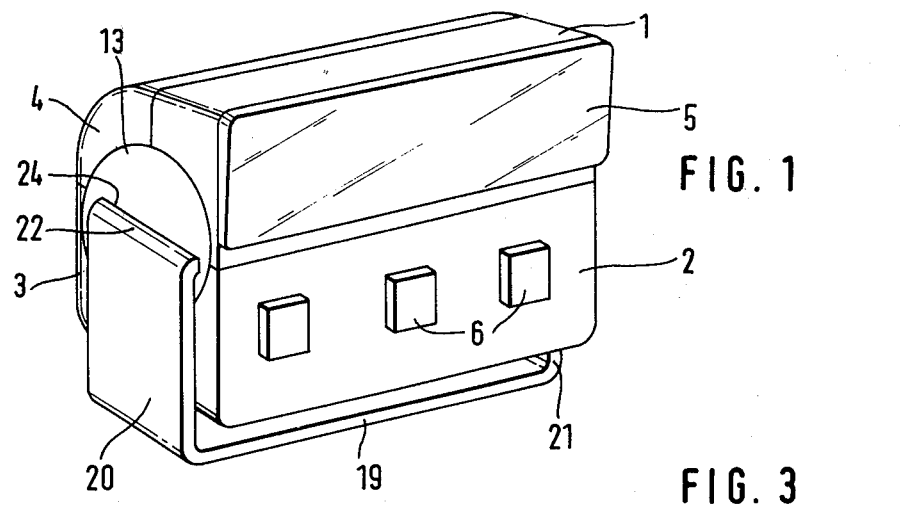
FIG. 1 is a perspective view of the measuring instrument housing of the invention.
Figures 2, 3:
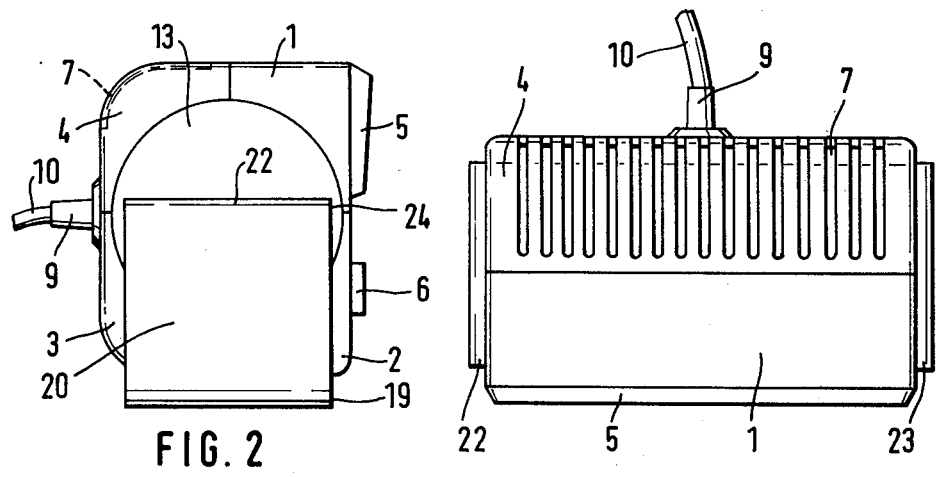
FIG. 2 is an end view of the measuring instrument housing according to FIG. 1.
FIG. 3 is a top view of the measuring instrument housing according to FIG. 1.

The housing, which is provided to receive an instrument, such as a digital clock, is shown comprising four housing elements or walls 1, 2, 3 and 4 preferably made of plastic. The housing top-element 1 is provided with an inspection or viewing window 5, behind which is located the digital display of the clock. Three adjusting knobs 6 project from the front lower element 2 of the housing, with which the time can be switched to the date display. The upper rear housing element 4 is provided with ventilation slits 7, through which the Joules heat-units produced by the clock can escape from the housing. Lower rear housing element 3 mates with its upper rim with the lower rim of element 3, which adjoins element 1, the latter in turn resting with its lower rim on element 2. The upper and lower rear housing elements are each provided on their sides with semi-circular recesses 8 to receive a flexible strain relieving sleeve 9, through which the power cord 10 enters the housing. A flexible strain relieving sleeve 9 is shown in FIG. 3.

Figure 4:
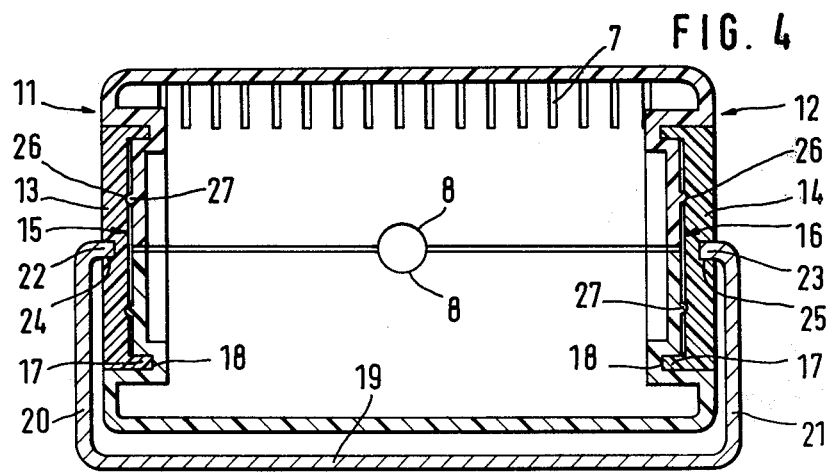
FIG. 4 is a longitudinal end view of the measuring instrument housing according to FIG. 1.

Two circular intermediate elements 13 and 14 are provided located as shown on FIG. 4 in respective housing recesses 15 and 16 in the two opposite end wall surfaces 11 and 12 of the housing. The housing recesses 15 and 16 and the thickness of the intermediate elements 13 and 14 are selected so that the intermediate elements 13 and 14 lie flush with the end wall surfaces of the housing.

Each of the two intermediate elements 13 and 14 is provided with an annular collar 17, which engages in a circular groove 18 formed by four quarter-circles in the four housing elements. As a result of this the intermediate elements 13 and 14 can rotate in the recesses 15 and 16 relative to the housing elements without affecting the position of the four housing elements relative to each other and without danger of any of the housing elements falling out of the composite unit.

The two intermediate elements 13 and 14 are pressed toward the interior of the recesses 15 and 16 by means of a stirrup clamp 19, the two shanks 20 and 21 of which are elastically prestressed with the free angled ends 22 and 23 thereof engaging in corresponding grooves 24 and 25 in the intermediate elements 13 and 14. The intermediate elements 13 and 14 are thus prevented from falling out of the recesses 15 and 16 by the stirrup clamp which may be made, for example, of stainless steel.

On their frontal surfaces facing the recesses 15 and 16, the two intermediate elements 13 and 14 include a plurality of recesses 26, which are arranged equidistantly spaced from each other in a circle concentric to the outer periphery of the intermediate element. These recesses 26 correspond with projections 27 arranged also spaced equidistantly in a circle of the same diameter. These projections are formed on the walls of the recesses 15 and 16 adjacent the intermediate elements 13 and 14. The recesses 26 and the projections 27 thus form a ratchet stop which prevents an unintentional pivoting of the housing relative to the stirrup clamp.

This objective is achieved in accordance with the invention in that a recess and/or a projection is provided on each side of a separating line on two opposite wall surfaces formed by at least two housing elements. This recess and/or projection corresponds with a projection and/or a recess of an intermediate element mounted on the wall surface, and the stirrup clamp engages the two wall surfaces of the intermediate element under resilient pressure.

In the housing according to the invention the individual housing elements are held together by the two intermediate elements which in turn are pressed against the wall surfaces by the stirrup clamps, so that they are prevented from falling out. The mounting of the housing takes place in such a manner that after the measuring instrument is put in place in one of the housing elements the other housing elements, optionally including a viewing window, are placed about the measuring instrument to form the housing. In sequence, the two intermediate elements are placed on the wall surfaces and finally the two intermediate elements are tightened with the aid of the stirrup clamp so that all elements are fixed in their respective places. In order to repair or replace the measuring instrument, its dial face plate or its other elements, the stirrup clamp and the two intermediate elements are simply removed in order to separate the housing into its individual elements, thus simplifying the opening thereof to proceed with the repair or replacement. Use of any special tools in these operational steps is avoided and any special dexterity is unnecessary. This latter fact has an especially favorable effect on the mounting costs of the housing and repair costs of the instrument.

According to an advantageous embodiment of the invention the intermediate elements are arranged on the two side walls of the housing.

A further advantageous embodiment is provided wherein the intermediate elements are arranged on the top and bottom sides of the housing.

The invention may be practiced in either of the two following embodiments:

In a two-part housing having a separating plane running parallel to the viewing window so that the intermediate elements can be arranged on both side walls or on the top and bottom sides or walls of the housing, or in a two-part housing having a separating plane running approximately perpendicularly to the viewing window while the two intermediate elements can be arranged only on the two side walls of the housing.

Which of the two possibilities should finally be used depends not only on the subdivision of the housing, but also on the aesthetic effect intended to be achieved with the stirrup clamp.

Thus for example in a housing having a flat, long front surface the two intermediate elements should be disposed at the two end walls, while in a housing having a narrow, high housing surface the two intermediate elements should be provided preferably on the top or bottom side.

Particularly from the standpoint of aesthetics it has proven to be effective to arrange each intermediate element in a recess in the housing in such a manner that the outer surface of the intermediate element and the housing surface are flush with each other. Furthermore, by placing the intermediate elements in corresponding housing recesses the mounting of the housing is simplified and the interlocking of the individual elements is improved.

According to an advantageous embodiment of the invention, as shown, each intermediate element is circular and is provided on one frontal surface with an annular groove or an annular collar and a collar corresponding with the groove or a groove corresponding with the collar are present in the wall. This type of embodiment of the intermediate element and wall surface allows a relative movement of the two intermediate elements relative to the housing. The stirrup clamp engaging the intermediate elements can be pivoted relative to the housing, thus allowing the housing to be adjusted for optimal reading by the viewer when the stirrup clamp is attached to a mounting surface.

The pivoting of the stirrup clamp relative to the housing can also be realized with intermediate elements which are not movable in the housing, in that the stirrup clamp is pivotably mounted in the two intermediate elements. Since however, this cannot be accomplished without an effect on the shape of the stirrup clamp, such an arrangement would be connected with disadvantages to the overall aesthetic designs of the measuring instrument housing. To secure the adjusted relative position of the stirrup clamp and the housing the ratchet stop preferably should be provided between one of the two intermediate elements and the wall surface. This is most effectively formed by a plurality of projections arranged in the concentric circle and associated with the intermediate element of the wall surface and by the corresponding plurality of recesses arranged in a concentric circle of the same diameter associated with the wall surface or the intermediate element. Especially if the housing and the two intermediate elements are made of plastic, which is generally the case, the projections and recesses in the housing and the intermediate elements which form the ratchet stop can be made integral therewith during the manufacture thereof.

What we claim as new and desire to secure by United States Letters Patent is:

1. A housing assembly for measuring instruments comprising a plurality of detachable casing parts mutually connectable to form an assembled casing, one of said casing parts comprising a viewing window for the measuring instrument, said assembled casing being bounded by two opposite walls in spaced relation to each other, portions of said casing parts defining said opposite walls, a separate intermediate element mounted on and corresponding to each of said opposite walls, the respective intermediate element corresponding to each respective opposite wall being in interfitting relation to its corresponding wall, and a resilient stirrup clamp including oppositely disposed portions which each respectively engage a corresponding one of said separate intermediate elements to thus place each intermediate element and the corresponding one of said opposite walls with which the respective intermediate element is in interfitted relation under an elastic pressure which holds said casing in assembled relation.

2. A housing assembly as defined in claim 1 in which said opposite walls are provided with recesses to receive the corresponding intermediate elements.

3. Housing as claimed in claim 2,
said intermediate elements being arranged in said recesses in such a manner that the outer surface of said intermediate elements and the housing surfaces are flush with each other.

4. Housing as claimed in claim 2,
said stirrup clamp being elastically prestressed, with free-angled ends;
two of said intermediate elements having grooves engaging the free ends of said stirrup clamp, the two intermediate elements being pressed toward the interior of the recesses to prevent them from falling out of the recesses.

5. A housing assembly for measuring instruments comprising a plurality of detachable casing parts mutually connectable to form an assembled casing, one of said casing parts comprising a viewing window for the measuring instrument, said assembled casing being bounded by two opposite walls in spaced relation to each other, said assembled casing comprising a division plane extending from one of said opposite walls to the other of said opposite walls, with casing parts lying on opposite sides of said division plane, portions of said casing parts defining said opposite walls, a separate intermediate element mounted on and corresponding to each of said opposite walls, the respective intermediate element corresponding to each opposite wall being in interfitting and bridging relation to the casing parts lying on opposite sides of said division plane at each respective opposite wall, and a resilient stirrup clamp including oppositely disposed portions which respectively engage a corresponding one of said separate intermediate elements to thus place each intermediate element and the corresponding one of said opposite walls under an elastic pressure which holds said casing in assembled relation.

6. A housing assembly as defined in claim 5 in which said viewing window extends in the same direction as said division plane.

7. A housing assembly as defined in claim 5 in which said opposite walls define the opposite end walls of said assembled casing, said assembled casing additionally comprising oppositely disposed parallel side walls extending longitudinally of said assembled casing from one of said end walls to the other of said end walls, said assembled casing additionally comprising an upper wall and a bottom wall in oppositely disposed relation to each other, said division plane extending from one of said end walls to the other of said end walls, each of said separate intermediate elements being mounted on and corresponding to one of said end walls and in interfitting and bridging relation to the casing parts lying on opposite sides of said division plane at each respective one of said end walls, said oppositely disposed portions of said stirrup clamp each respectively engaging a corresponding separate intermediate element to thus place each intermediate element and the corresponding one of said opposite walls under an elastic pressure which hold said casing in assembled relation.

8. A housing assembly as defined in claim 7 in which said viewing window is carried by one of said oppositely disposed parallel side walls and extends in a direction parallel to said division plane.

9. A housing assembly as defined in claim 5 in which said opposite walls define the opposite top wall and bottom wall of the assembled casing, said assembled casing additionally comprising oppositely disposed end walls, and additionally comprising oppositely disposed parallel side walls extending longitudinally of said assembled casing from one of said end walls to the other of said end walls, said division plane extending from said top wall to said bottom wall, said respective intermediate elements being mounted on said top and bottom walls respectively of said casing and in interfitting and bridging relation to casing parts lying on opposite sides of said division plane at the respective top and bottom walls, said oppositely disposed portions of said stirrup clamp each respectively engaging a corresponding one of said separate intermediate elements, to thus place each intermediate element and the corresponding one of said opposite walls under an elastic pressure which holds said casing in assembled relation.

10. Housing as claimed in claim 1 or 5,
    each intermediate element being generally circular and provided on one frontal surface with an annular groove or an annular collar, respectively mating with an opposite groove or collar in the housing.

11. Housing as claimed in claim 10 or 1, further comprising:
    a ratchet stop provided at least between one of said two intermediate elements and the walls.

12. Housing according to claim 11,
    said ratchet stop being formed by a plurality of projections arranged in a concentric circle and associated with said intermediate elements or the walls, respectively, and by a corresponding number of depressions arranged in a concentric circle of equal diameter and associated with the said wall surfaces or the intermediate elements.

13. Housing according to claim 1 or 5,
    said stirrup clamp simultaneously being a mounting support.

14. Housing as claimed in claim 5,
    two said intermediate elements being provided with an annular collar, which engages a circular groove formed by four quarter-circles in four housing elements, one of the intermediate elements being mounted rotatably in the recesses relative to the housing elements without affecting the position of the four housing elements relative to each other and without danger of any of the housing elements falling out of the composite unit.

* * * * *